(12) United States Patent
Schloss et al.

(10) Patent No.: US 7,638,798 B2
(45) Date of Patent: Dec. 29, 2009

(54) LAMINATED WAFER SENSOR SYSTEM FOR UV DOSE MEASUREMENT

(75) Inventors: Jim Schloss, Tigard, OR (US); Michele Winz, Woodbum, OR (US); Sam Mallicoat, Portland, OR (US); Wolfram Urbanek, Camas, WA (US); Guang Li, Beaverton, OR (US); Larry Potter, Colorado Springs, CO (US); Kevin Shea, Vancouver, WA (US)

(73) Assignee: Coherent, Inc., Santa Clara, CA (US)

( * ) Notice: Subject to any disclaimer, the term of this patent is extended or adjusted under 35 U.S.C. 154(b) by 463 days.

(21) Appl. No.: 11/801,443

(22) Filed: May 10, 2007

(65) Prior Publication Data

US 2008/0048285 A1   Feb. 28, 2008

Related U.S. Application Data

(60) Provisional application No. 60/839,768, filed on Aug. 24, 2006.

(51) Int. Cl.
*H01L 23/58* (2006.01)

(52) U.S. Cl. ............ 257/48; 257/E33.001; 355/72; 355/53; 250/252.1

(58) Field of Classification Search ............ 257/48, 257/E33.001; 250/252.1; 355/72, 53; 156/345.24
See application file for complete search history.

(56) References Cited

U.S. PATENT DOCUMENTS

| | | | |
|---|---|---|---|
| 5,746,513 A | 5/1998 | Renken | 374/179 |
| 5,929,689 A | 7/1999 | Wall | 327/362 |
| 5,967,661 A | 10/1999 | Renken et al. | 374/126 |
| 5,997,779 A | 12/1999 | Potter | 264/40.1 |
| 6,045,730 A | 4/2000 | Potter | 264/40.1 |
| 6,190,040 B1 | 2/2001 | Renken et al. | 374/185 |
| 6,325,536 B1 | 12/2001 | Renken et al. | 374/161 |
| 6,542,835 B2 | 4/2003 | Mundt | 702/65 |
| 6,616,332 B1 | 9/2003 | Renken et al. | 374/162 |
| 6,671,660 B2 | 12/2003 | Freed | 702/188 |
| 6,691,068 B1 | 2/2004 | Freed et al. | 702/187 |
| 6,738,722 B2 | 5/2004 | Polla et al. | 702/104 |
| 6,741,945 B2 | 5/2004 | Polla et al. | 702/104 |
| 6,789,034 B2 | 9/2004 | Freed | 702/104 |
| 6,889,568 B2 | 5/2005 | Renken | 73/866.1 |
| 6,907,364 B2 | 6/2005 | Poolla et al. | 702/65 |
| 6,915,589 B2 | 7/2005 | Sun et al. | 33/645 |
| 6,971,036 B2 | 11/2005 | Freed | 713/322 |
| 2006/0103832 A1* | 5/2006 | Hazelton et al. | 355/72 |

* cited by examiner

*Primary Examiner*—Sue Purvis
*Assistant Examiner*—Selim Ahmed
(74) *Attorney, Agent, or Firm*—Morrison & Foerster LLP

(57) ABSTRACT

A laminated wafer sensor structure includes a housing layer having pocket openings formed therein, a circuit layer having a sensor element and electronic components mounted for registration with the pocket openings in the housing layer, and a rigid back layer. The laminated structure is suitable for handling by conventional robotic wafer handling systems. The wafer sensor structure is adapted for electrical connection to a base station that is also adapted for connection to a host computer system to facilitate communication among the sensor structure, the base station and the host computer.

19 Claims, 9 Drawing Sheets

LAMINATED WAFER SENSOR SYSTEM FOR UV DOSE MEASUREMENT

PRIORITY CLAIM

This application claims priority from U.S. Provisional Application No. 60/839,768, filed on Aug. 24, 2006, by Schloss et al., titled "Wafer Sensor System for UV Dose Measurement." U.S. Provisional Application No. 60/839,768 is hereby incorporated herein by reference in its entirety.

FIELD OF THE INVENTION

The present invention is directed to wafer sensors and, in particular, to a laminated wafer sensor system that is compatible with transfer by robotic wafer handling systems.

BACKGROUND OF THE INVENTION

For the last decade, pyroelectric sensors have been used as the primary standard for UV dose calibration of excimer laser based lithography tools. At regular calibration intervals, the lithography tool is opened, the pyroelectric sensor is inserted onto the tool's wafer stage and dose measurements are taken. While these measurements are very useful as a calibration procedure, significant down time is created by opening the tool to insert the sensor.

In conventional immersion lithography processes, de-ionized (DI) water covers the gap between the projection lens of the lithography tool and the wafer. Because of even greater contamination concerns, opening the stage for dose calibration becomes even less desirable for immersion lithography.

U.S. Pat. No. 6,889,568, which issued on May 10, 2005, discloses a measuring device that incorporates a substrate with sensors that measure the processing conditions that a wafer may undergo during manufacturing. The substrate can be inserted into a processing chamber by a robot head and the measuring device can transmit the conditions in real time or store the conditions for subsequent analysis. In the measuring device disclosed in the '568 patent, the electronics platform is mounted on a recessed portion of the load bearing substrate.

U.S. Pat. No. 6,691,068, which issued on Feb. 10, 2004, discloses a sensor apparatus that is capable of being loaded into a process tool. From within the process tool, the sensor apparatus is capable of measuring, storing and transmitting data in near real time. As in the case of the '568 patent, in the apparatus disclosed in the '068 patent, the substrate is the load bearing foundation that carries the load of the sensor, the information processor and the power source.

SUMMARY OF THE INVENTION

The present invention provides a wafer sensor system that utilizes a laminated wafer sensor structure that includes a pyroelectric element bonded to a flex circuit, which is then bonded to a carrier "ring." The UV dose sensor, which preferably has the same profile as a 200 mm or 300 mm silicon wafer, allows for measurements at the wafer stage of a lithography tool without opening the lithography system. The wafer-sized sensor is sent to the stage utilizing the tool's existing robotic wafer handling system. The sensor is wireless, low-outgassing and capable of storing more than one hundred dose measurements. After exposure on the stage, an external readout base station is used to download the dose measurements from the sensor to a host computer. Typically, it takes two to four minutes for a wafer to exit a lithography system via the robotic wafer handling system. Because of this handling time, the sensor system is capable of storing a dose measurement signal with minimal decay for at least two minutes.

Other features and advantages of the present invention will become apparent from a review of the specification, claims and appended drawings.

DETAILED DESCRIPTION OF THE INVENTION

Figure 1A:
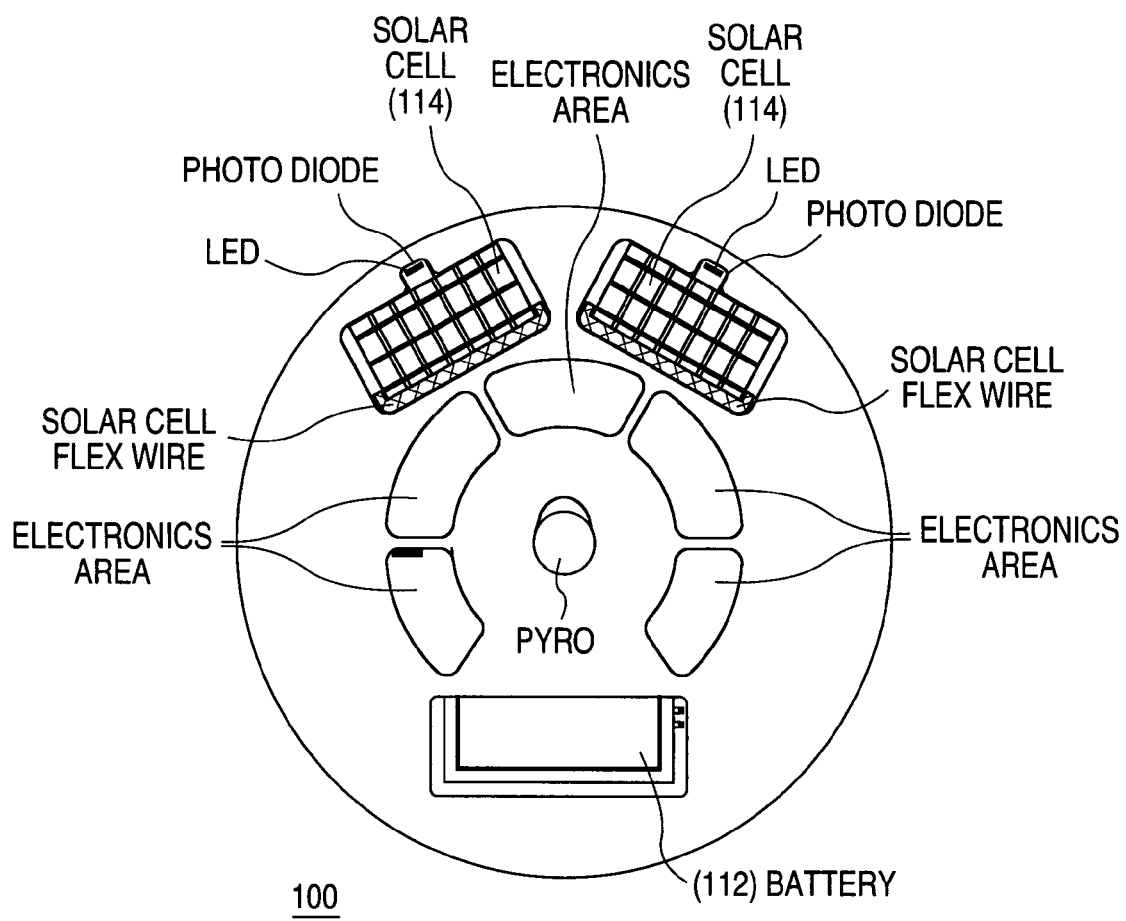
FIG. 1A is a plan view showing the upper surface of a wafer sensor in accordance with the present invention.
Figure 1B:
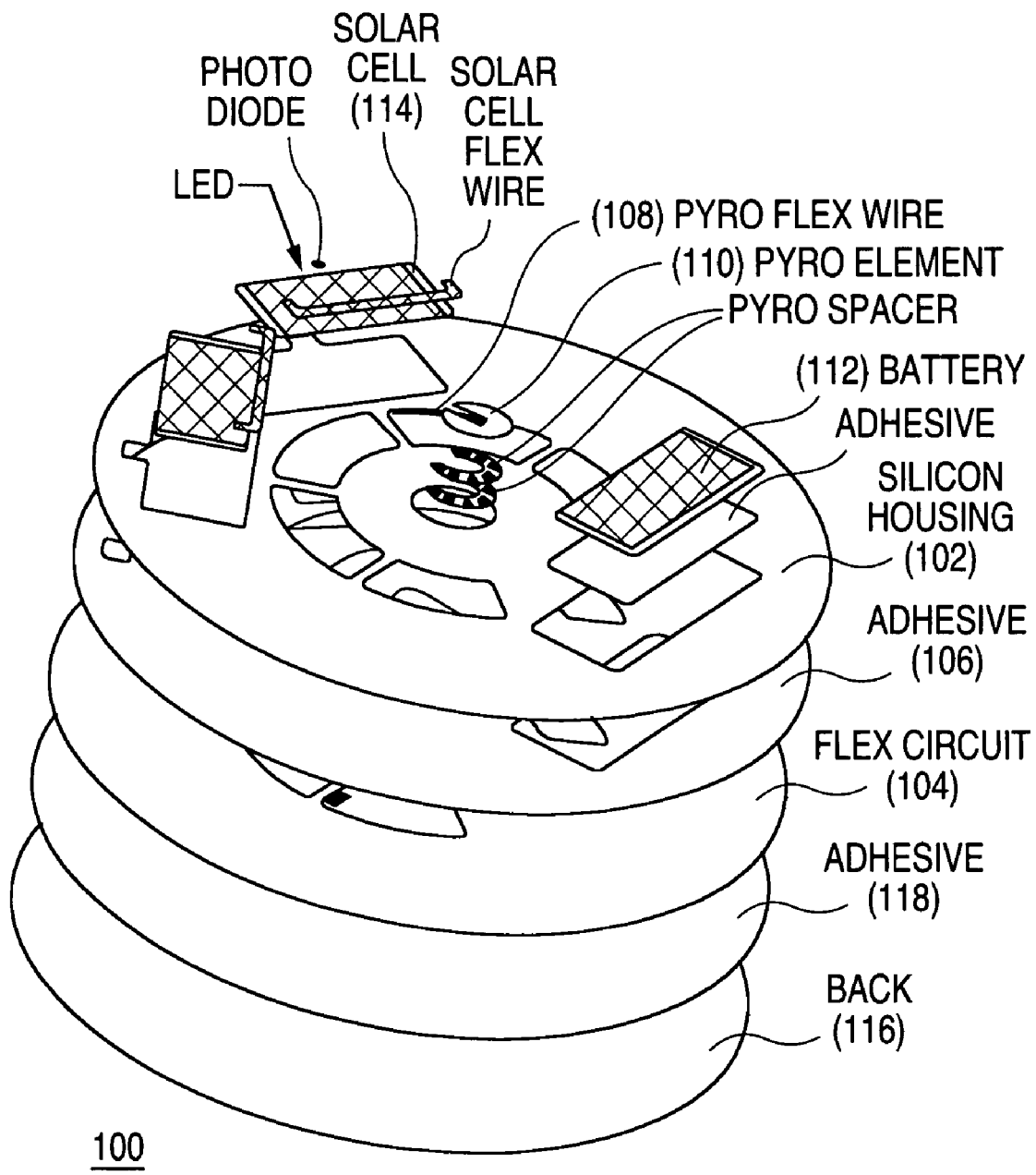
FIG. 1B is an exploded perspective view illustrating the laminated structure of a wafer sensor in accordance with the present invention.

An embodiment of a wafer sensor system 100 in accordance with the present invention is shown in FIGS. 1A and 1B. The wafer sensor system 100 can be utilized for both immersion and dry UV dose measurement in lithography tools. The structure 100 is preferably made with the same profile as a 200 mm or a 300 mm diameter semiconductor wafer of the type utilized in the manufacture of integrated circuits. FIGS. 1A and 1B show a 300 mm diameter wafer embodiment of the invention.

As shown in FIGS. 1A and 1B, in accordance with the invention, the wafer sensor system 100 has a laminated construction. The outer "housing" is formed by laser cutting openings through a semi-standard silicon wafer 102. A flexible or semi-rigid circuit board 104 populated with integrated circuits (ICs) and other electronic elements discussed in greater detail below is bonded to the silicon wafer housing 102 using an intermediate layer of thin film adhesive 106. The integrated circuits on the circuit board 104 fit through the laser cut openings in the silicon wafer housing 102. A pyroelectric sensor element 108 is first bonded to flex circuit wire 110, then to a chemically etched heat sink shim (not shown), and finally to the flex circuit board 104 with epoxy. A thin film battery 112 and solar cells 114 are also bonded to the flex circuit board 104. A stainless steel or plastic film back layer disk 116 is attached to the back of the flex circuit 104 via an intermediate layer of thin film adhesive 118. The back layer disk 116 provides the additional flatness, smooth finish and strength required for handling by the robotic wafer handling system of a lithography tool.

The electronics, battery and solar cell pockets are potted using a low outgassing epoxy. The potting epoxy provides additional strength and protects the electrical connections from DI-water in an immersion measurement tool environment.

In a preferred embodiment of the invention, the final thickness of the wafer sensor system 100 is less than 1.35 mm. Recessing the electronics within the openings of the silicon housing 102 reduces the overall thickness of the assembly 100. In a preferred embodiment, the warp of the wafer sensor system 100 over the full 300 mm diameter of the wafer is less than 100 um. The use of pressure sensitive thin film adhesive 106, 110 between the wafer housing 102 and the flex circuit 104 and between the flex circuit 104 and the back disk 116, and room temperature cure epoxies for affixing the electronics components to the flex circuit 104, minimizes internal stress in the assembly 100. The low internal stress between the three laminated layers 102, 104, 116 helps minimize the warp of the sensor assembly 100. The flatness, smooth finish and rigidity of the laminated structure 100 allow for robot handling performance that matches that of a standard silicon wafer.

Figure 2:
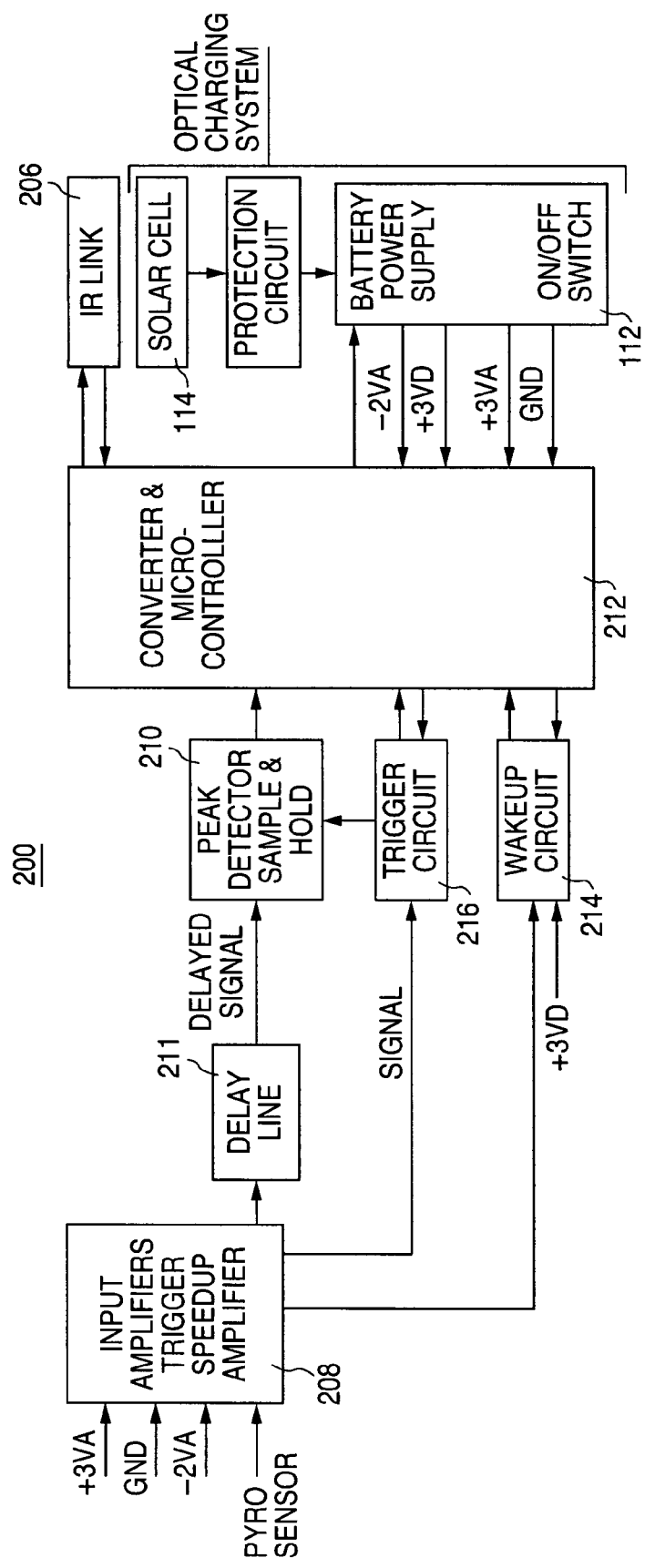
FIG. 2 is a block diagram illustrating an embodiment of measurement electronics utilizable in a wafer sensor in accordance with the present invention.

A block diagram of an embodiment of measurement electronics 200 mounted on the flex circuit board 104 of the wafer sensor system 100 is shown in FIG. 2. An on board rechargeable battery 112 (FIG. 1) powers the electronics 200 for up to about 2 hours. The battery 112 can be recharged via two solar cells 114 (FIG. 1). An IR emitter and receiver pair 206 is used to communicate data from the wafer sensor assembly 100 to a base station, which is not shown in FIG. 2, but is discussed in greater detail below. A trans-impedance amplifier 208 receives the laser energy pulse signal from the pyroelectric sensor 108. A fast peak detection sample-and-hold circuit 210 then captures the peak of the signal produced by each laser pulse via a delay line 211. An on board microprocessor 212 then reads the peak via an analog-to-digital (A/D) converter, shown in FIG. 2 as internal to the processor 212.

The microprocessor 212 sums multiple laser pulse energy measurements to compute UV dose. In addition to dose measurements, the microprocessor 212 also controls the solar recharge of the battery 112, a power saving sleep mode circuit 214, IR communications link 206 and data storage (not shown in FIG. 2). With this electronics approach, up to two hundred dose measurements can be taken during a single load onto the wafer stage. The IR link 206 also allows field upgrade of the firmware. Calibration and setup information is also stored in the read only memory (ROM) of the microprocessor 212.

Figure 3:
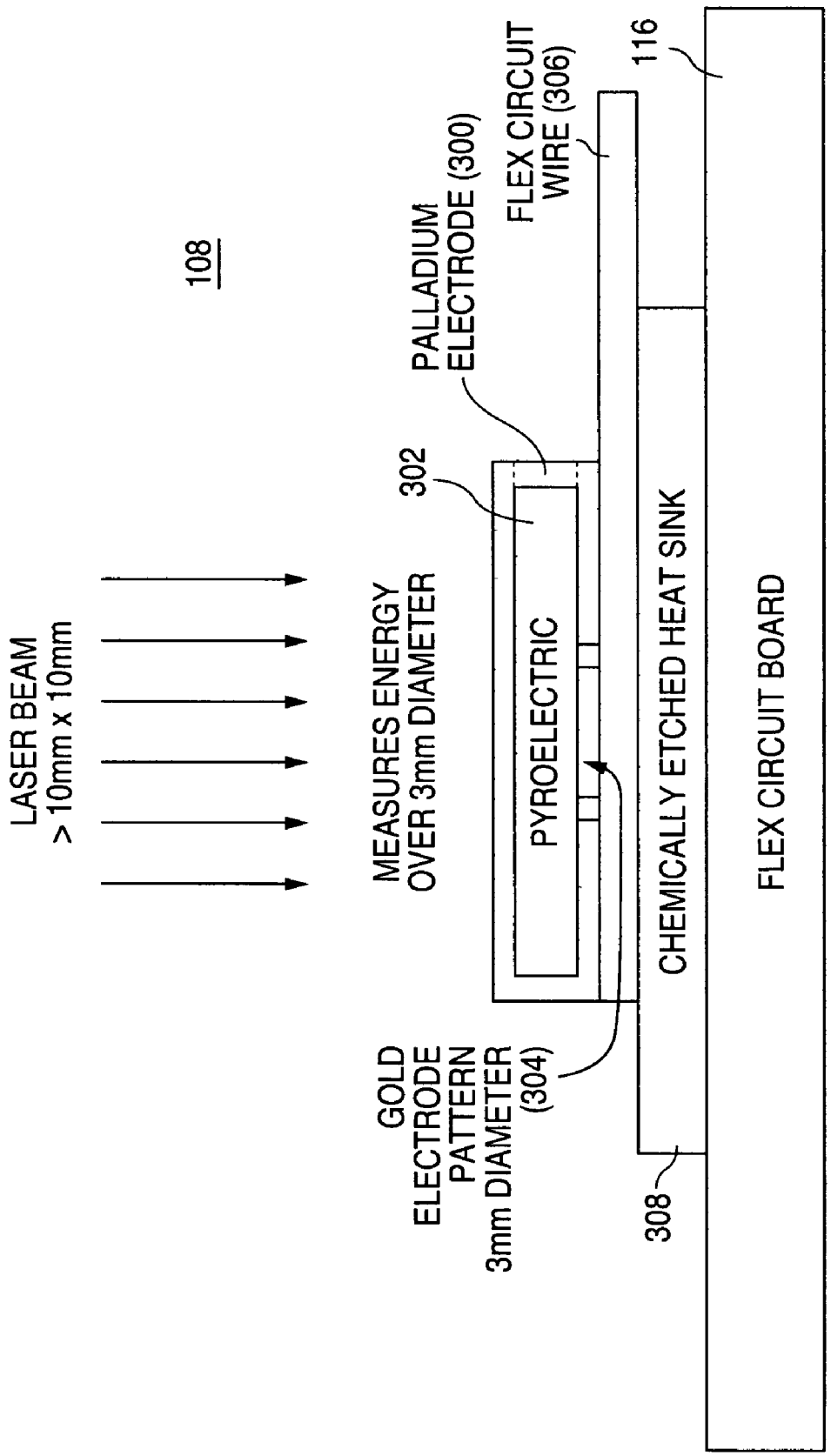
FIG. 3 is a partial cross section drawing illustrating an embodiment of a pyroelectric electrode pattern for a wafer sensor in accordance with the present invention.

Pyroelectric sensors measure laser energy. For calibration of lithography systems, the dose in units of energy per unit area (fluence) is required. Thus, to measure fluence with a pyroelectric sensor, energy is measured over a known aperture area (NA). For an immersion system, a physical aperture would limit the maximum NA that could be measured with high accuracy. To avoid using a physical aperture, in a preferred embodiment of the invention, the pyroelectric sensor 108 (FIG. 1) is patterned as shown in FIG. 3. As shown in FIG. 3, a palladium electrode 300 is formed around the pyroelectric 302 with a 3 mm gold electrode 304 formed at the bottom of the pyroelectric 302. This assembly is connected to the flex wire 306. A chemically etched heat sink 308 is provided between the flex wire 310 and the flex circuit board 116.

With the FIG. 3 electrode pattern, the pyroelectric 302 is sensitive to the laser energy only in the 3 mm diameter patterned disk 304. Thus, for a 26 mm diameter pyroelectric 302, only a 3 mm diameter disk 304 in the center responds to the laser energy. The fluence incident on the pyroelectric 302 is then calculated via the measured energy value divided by the area of the 3 mm disk 304.

Referring back to FIG. 2, arrival of a signal from the sensor element 108 causes three events to happen. One, the wake-up integrator 214 analyzes the accumulated energy and, if a certain wake-up threshold is exceeded, the microcontroller 212 is awakened from the "sleep" mode. Two, a trigger integrator 216 analyzes the accumulated energy and, if a certain trigger threshold is exceeded, the present value of the peak detector 210 is latched as an analog value. Three, the signal is passed through the delay line 211 to the peak detector 210. This delay is designed to match the latency of the trigger circuit 216, with its time constant of integration. Without the delay line 211, the peak value would pass before a triggered capture could occur.

The NA of the light is varied typically over the range 0.2 to 1.4 in a lithography tool. The angular response of the wafer sensor system must be flat over this range. Preferably, a diffuse surface is used for the pyroelectric. This diffuse surface provides a maximum measurement error of less than 5% over the NA range.

Figure 4:
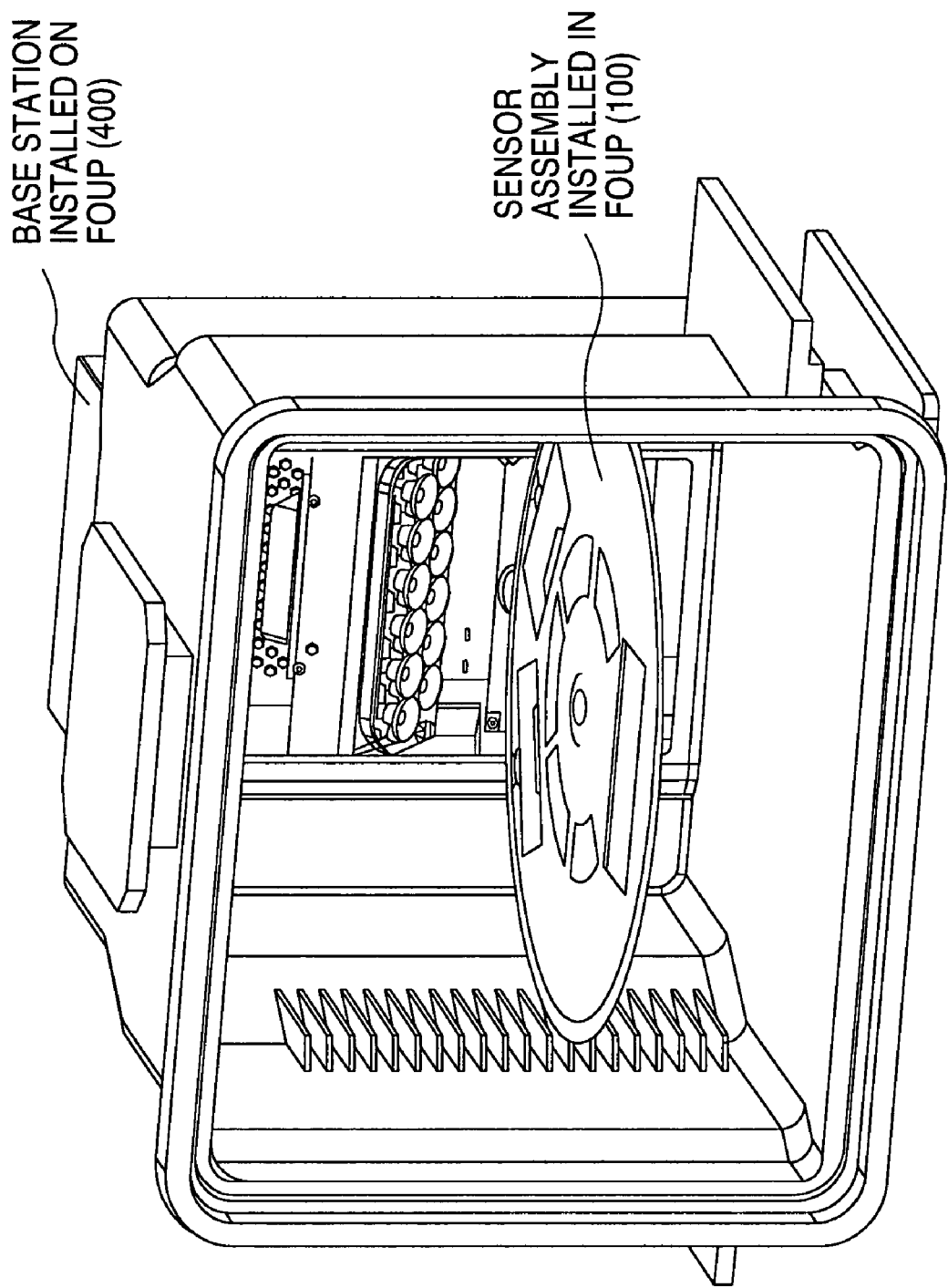
FIG. 4 is a schematic drawing illustrating a wafer sensor and base station in accordance with the present invention.

FIG. 4 shows an embodiment of a wafer sensor system 100 in a base station 400. A standard wafer carrier 402 known as a FOUP (Front Opening Unified Pod) is used in the base station 400. In the illustrated embodiment, a FOUP with a clear rear window is required. An electronics unit is mounted on the FOUP adjacent the clear rear window.

Figure 5:
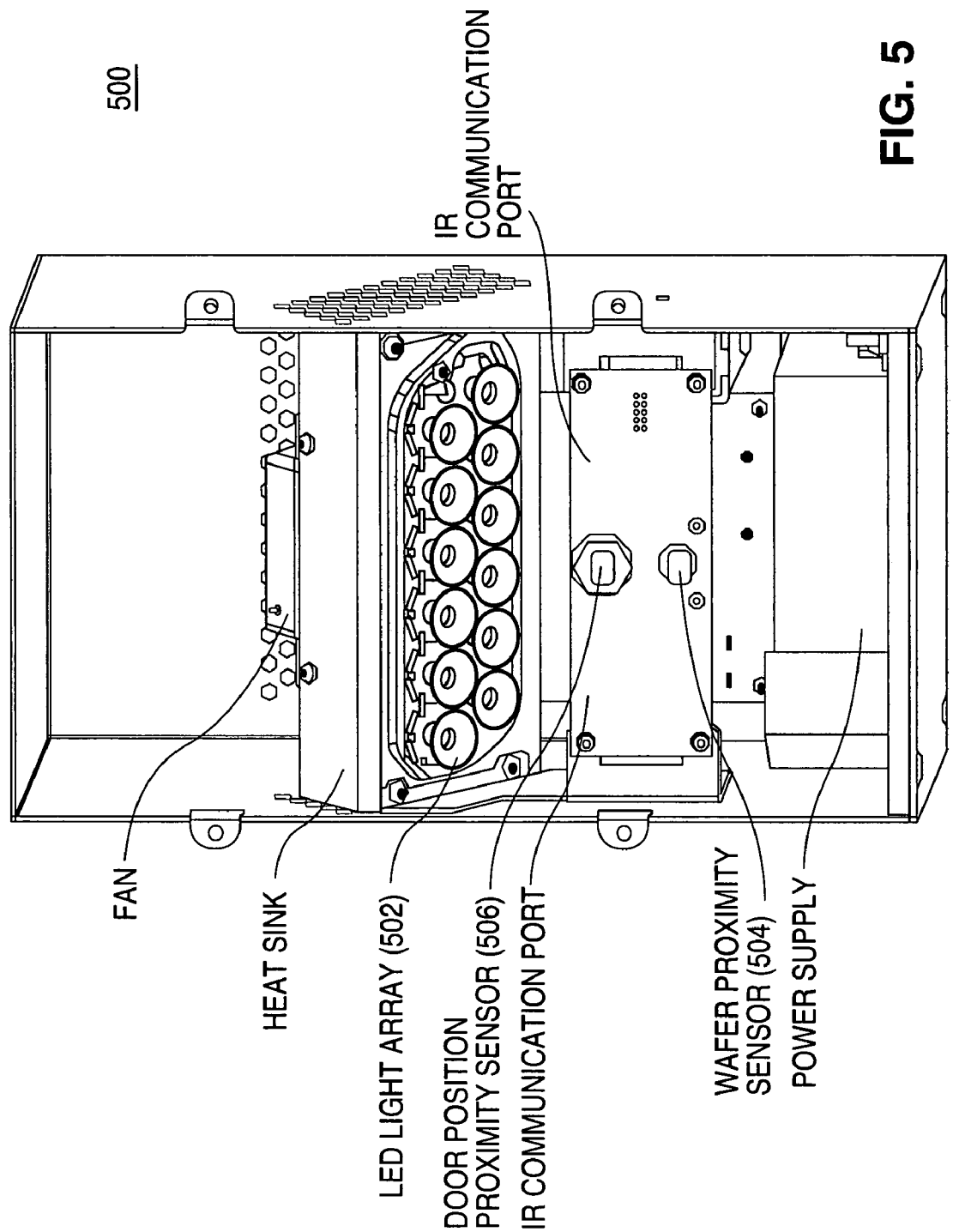
FIG. 5 is a schematic drawing illustrating base station electronics.

FIG. 5 shows the details of the base station electronics unit 500. An array 502 of red high power LEDs is used to recharge the wafer sensor battery 112 (FIG. 1) via the two solar cells 114 (FIG. 1). An IR emitter and receiver pair 206 (FIG. 2) communicates data to the wafer sensor system 100. The IR communications and optical recharging prevents possible damage to the wafer sensor system 100 that would be caused by mechanical contacts. It also allows the "clean" (low particle count) wafer within the FOUP to be isolated from the "dirty" (high particle count) electronics unit. Two proximity sensors 504, 506 detect the presence of the wafer sensor assembly 100 in the FOUP and the state of the FOUP door (open or closed), respectively. An RS-232 interface connects the base station to an external host computer. A microprocessor in the base station electronics unit controls the communication with host computers, optical charging of the wafer sensor battery 112, data exchange between the base station 400 and the wafer sensor system 100, and health and status diagnostics. On the front panel of the base station electronic unit 400, indicator lights showing battery and communication status are provided. Also buttons to reset the unit and to start the charging cycle are present.

Figure 6:
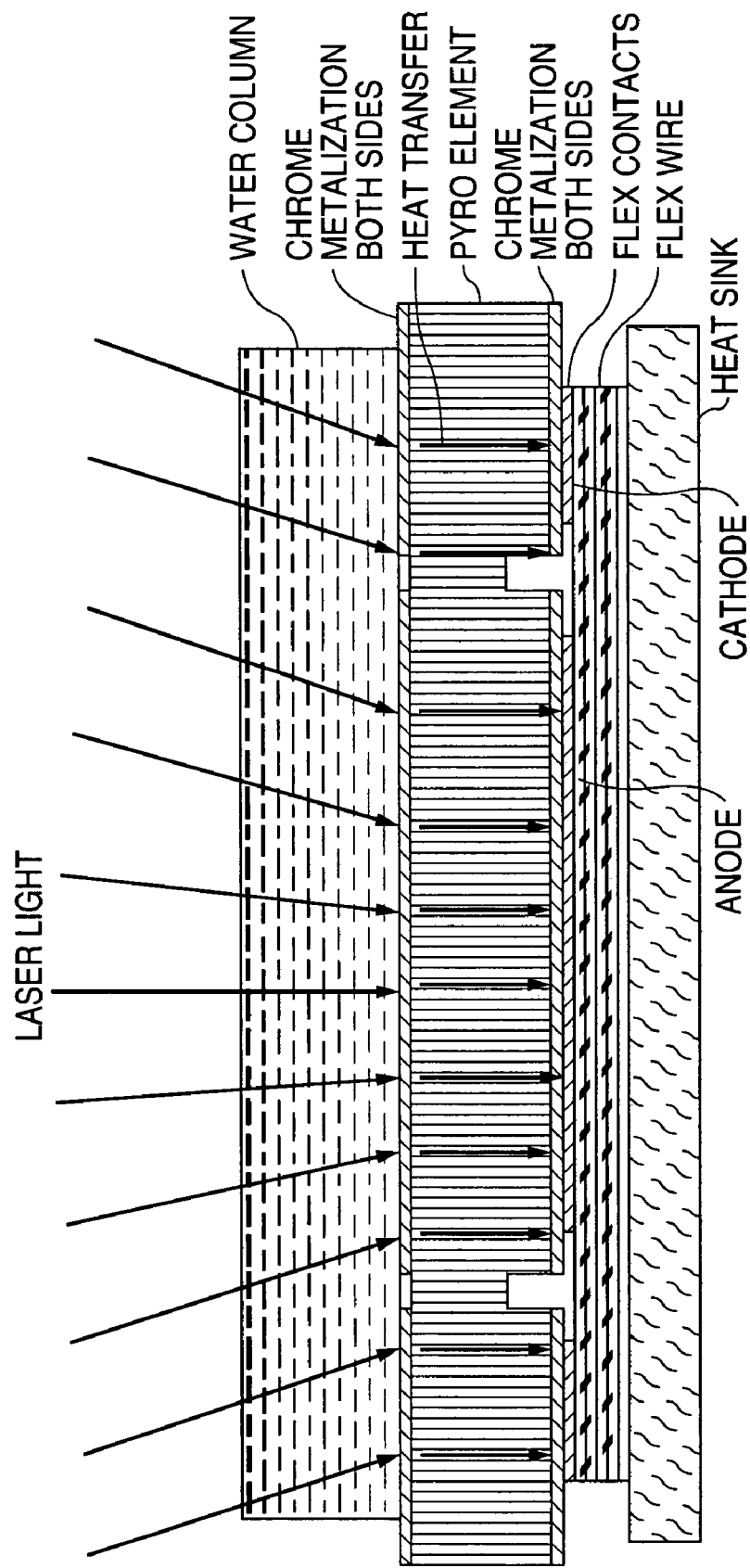
FIG. 6 is a partial cross section drawing illustrating greater detail of the FIG. 3 pyroelectric electrode pattern.

As noted above, a novel aperture technology is required to meet the NA requirements of the immersion stepper. Further details are shown in FIG. 6. This aperture includes an active area defined in the pyro element by laser-machining 3 mm diameter cuts in the top electrically conductive chrome layer on top of the pyro element and 3 mm diameter cuts into the pyro crystal in the bottom side. After further investigation, it was found that it was not necessary to machine the top surface. Further, only the electrode needs to be machined.

In both the FIG. 3 and the FIG. 6 approach, the patterning defines an effective cylinder that constitutes the effective volume of the pyroelectric element and electrically isolates the active region from the remaining bulk material. This limits the sensitivity of the element to the aperture size of 3 mm diameter.

The electrical contacts are such that the anode is connected only to the bottom side of the 3 mm active area. The cathode is continuous throughout the entire surface of the wafer, with the exception of the anode. A voltage forms across the z-axis of the pyro crystal corresponding to the dT/dt of absorbed laser energy and cooling. The surface of the pyro element is electrically common except for the active area. The voltage can only form over the anode of the active 3 mm area and the cathode along the z-axis of the crystal. The rejection of dT/dt outside the active area is relative to the uniformity of the crystal lattice. As can be seen from the FIG. 7 plots, the pyroelectric element is only significantly responsive in the active area.

Figure 7:
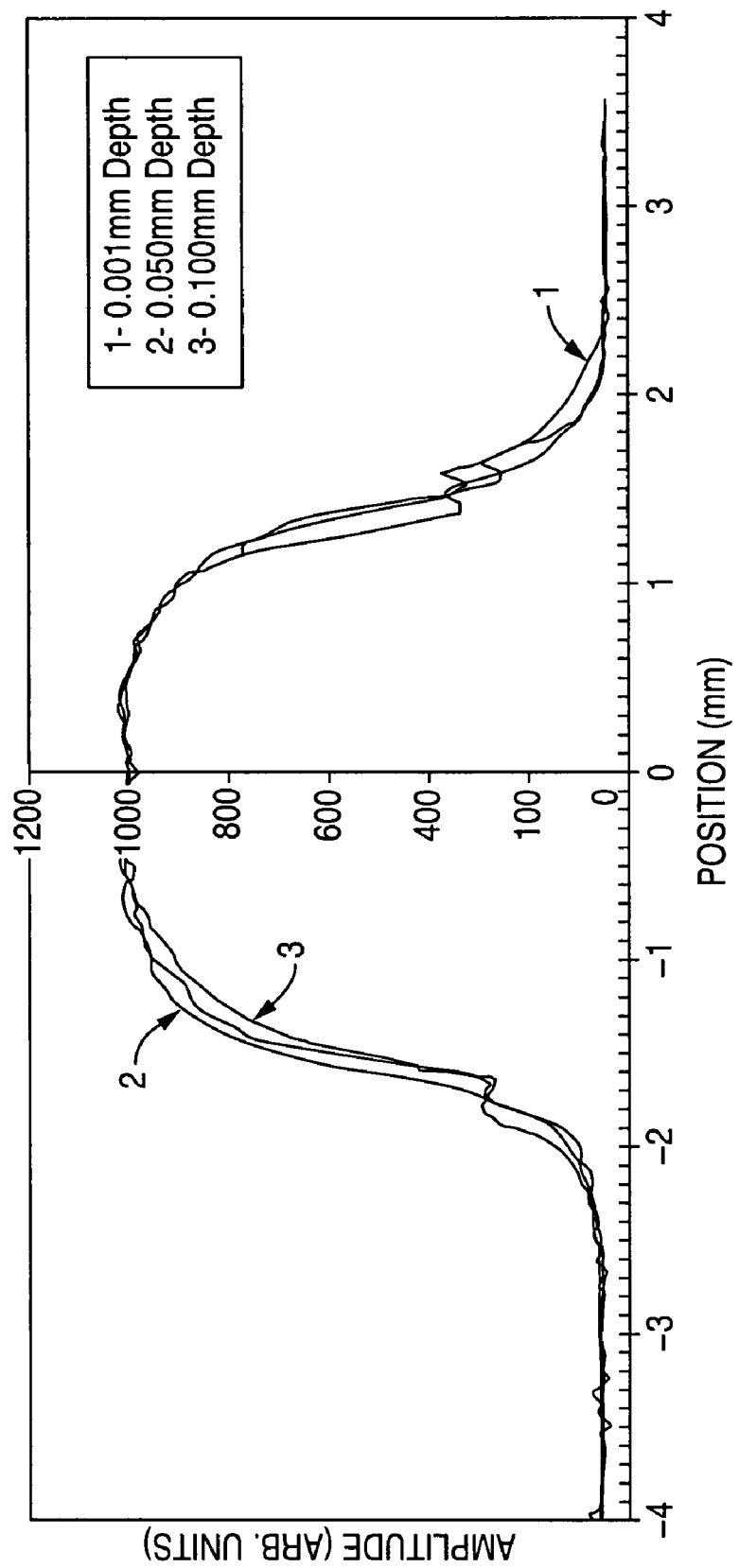
FIG. 7 is plot showing the spatial scan of three prototype apertures made in accordance with the FIG. 6 structure.

The plot in FIG. 7 shows the spatial scan of three prototype apertures made in accordance with FIG. 6. Each aperture is cut to different depths: 100 um, 50 um, and 1 um. Beam size for these scans was 200 um diameter. Data points were taken every 50 um across the diameter of the aperture.

A main feature of a wafer sensor system in accordance with the invention is its ability to handle like a standard silicon wafer. Specifically, the sensor system needs to be sufficiently flat on the bottom surface to allow handling with the relevant vacuum arms and stages. The sensor needs to be light enough to avoid overloading the vacuum arms. Finally, the sensor needs to be sufficiently thin to allow it to travel within the target equipment like a standard silicon wafer.

The rigid flex material is stiffer, thinner, and lighter than standard flex material. The enhanced stiffness improves the flatness of the bottom surface, particularly in areas where the flex is not directly supported by the silicon frame. This can significantly improve robotic handling of the sensor.

The flexible printed circuit design is, thus, optimized for thinness and dimensional stability in the following ways: a single layer with copper applied to opposing sides provides a symmetrical design that in inherently thinner, stronger and more warp-resistant than conventional multi-layer designs with asymmetrically placed areas of copper. In pursuit of this objective, the thinnest available polyimide material, having the DuPont trademark Kapton®, is a preferred embodiment of the substrate used in the present invention. As discussed herein, minimal etching is performed, resulting in large areas of non-functional copper opposing a monolithic ground plane.

The goal is to laminate two materials (substrates A and B) together using Pressure Sensitive Adhesive (PSA), with the requirement that the two substrates are aligned with each other and that minimal air bubbles are trapped between the two substrates. At least one of the two substrates is flexible, although the degree of flexibility need not be much (elastic deformation with a radius of curvature less than 5 m).

Figure 8:
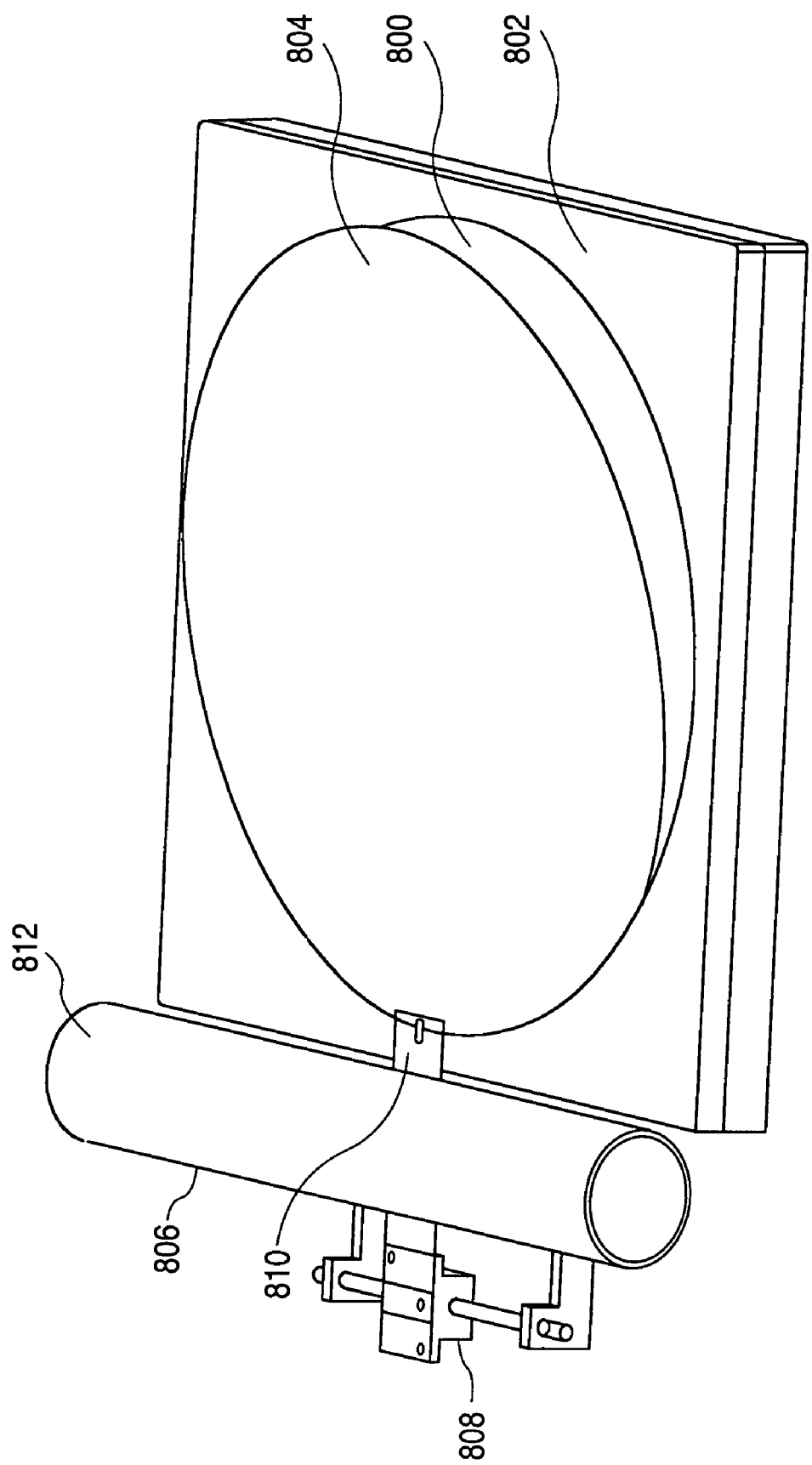
FIG. 8 is a schematic drawing illustrating steps in the manufacture of a wafer sensor system in accordance with the present invention.

With reference to FIG. 8, a substrate 800 is held flat and immobile by vacuum chuck 802. A PSA sheet 804, packaged between two backing layers, is place onto and aligned to the substrate 800. While aligned, the PSA sheet 804 is fixed to the flexible arm 806 with removable tape or other means (vacuum pickup, etc.). The arm 806 is attached to a bearing block 808 pivots around a shaft 810. In this configuration, the arm 806 can rotate out of the plane of the vacuum chuck 802, but will always return to the exact same location when moved back into contact with the vacuum chuck 802. The PSA sheet 804, along with arm 806, can now be moved off of the substrate 800, allowing the bottom backing layer from PSA 804 to be removed. PSA 804 is now lowered back onto substrate 800 at an angle, so that the portion of PSA 804 attached to the arm 806 makes contact with substrate 800 first. A roller 812 is rolled across arm 806, onto PSA 804 and across the entirety of PSA 804, allowing the bond line between substrate 800 and PSA 804 to move sequentially from the initial contact area underneath arm 806 to the far end of substrate 800 (i.e., to the right in FIG. 8). Consequently, air is expelled between the layers 804 and before the layers adhere to each other. Arm 806 can now be removed from PSA 804.

In one embodiment of the invention, substrate 802 is then placed back onto vacuum chuck 802, with PSA 804 facing up (not in contact with chuck 802). A second substrate (not shown) is placed onto PSA 804 and aligned to relevant features on substrate 800 and PSA 804. With alignment achieved, arm 806 is attached to the second substrate which is rotated off PSA 804. The remaining backing layer is then removed from PSA 804, and the second substrate is rolled onto PSA 804 in the same manner as described above. In this embodiment, substrate 800 may be rigid or flexible, but the second substrate, must be flexible.

In an alternate embodiment of the invention, PSA 804 is rolled onto substrate 800 as described previously. Substrate 800 is removed from vacuum chuck 802 and the second substrate is placed onto the vacuum chuck 802 and immobilized. Substrate 800, with PSA 804 facing down, is placed onto and aligned to the second substrate. Arm 806 is attached to substrate 800 once alignment is achieved. Substrate 800 can now be rotated off the second substrate, allowing the final backing layer to be removed from PSA 804. Substrate 800 is now rolled onto the second substrate, as described previously. In this embodiment, the second substrate maybe rigid or flexible, but substrate 800 must be flexible.

Ideally, the openings in the silicon housing 102 (FIG. 1) should be as small as possible, circular, and with maximum spacing between holes and a somewhat larger distance from holes to the wafer edge. If circular holes are not possible, then all corners should be radiused to minimum of 5 mm (3/16 in).

The spacing of the openings is dependent on the wafer diameter and thickness. For the standard 300 mm×0.775 mm silicon wafer, hole-to-wafer edge spacing should not be less than 30 mm, while the spacing between holes should not be less than 20 mm. For the standard 200 mm×0.725 mm silicon wafer, hole-to-wafer edge spacing should not be less than 15 mm, while the spacing between holes should not be less than 10 mm. For both the 300 mm and 200 mm wafers, the total hole area should not exceed 30% of the wafer area.

For alignment purposes, the holes should be sized so that the minimum spacing between the hole edge and any component or pad on the flex attached to the silicon housing should be 1 mm or twice the component height, whichever is larger.

The wafer sensor firmware upgrade or reprogramming utilizes the same physical IR link as that for normal sensor to base station communications. The reprogramming demands three unique pieces of software/firmware that reside in the wafer sensor, the base station and a host computer, respectively. The software in the host computer will initiate an upgrade process by sending special commands to the wafer sensor and the base station. These commands will place the sensor and base station in the upgrade mode (as opposed to normal application mode). After the commands are sent, the host software will upload the new code, typically one section at a time, to the base station via a standard serial cable. The base station processes the code then passes it to the wafer sensor via the IR link. The wafer sensor and the base station will be restored to the normal application mode automatically after the sensor is successfully reprogrammed.

Special algorithms and processes are developed and built in the aforementioned software and/or firmware to ensure a high degree of reliability and consistence for the reprogramming. Segments of the firmware can be reprogrammed separately or independently.

The firmware includes a battery conserving sleep mode where the "wake up" into measurement mode is caused by the signal from the sensor. For a pyroelectric sensor "wake up" can be caused by a specific laser pulse temporal pattern fired onto the sensor.

When a prototype wafer sensor is loaded onto the wafer stage, a specific timed laser pulse pattern is used to wake up the sensor from sleep.

With reference back to FIG. 2, the preferred embodiment of the present invention also includes a remotely activated ON/OFF switch whereby the electronics may be effectively disconnected from the battery and, thus, extend the operational life between recharge or replacement of the batteries. Since the thinness and hermetic isolation of the wafer sensor system precludes mechanical switching, an electromagnetic or optical switch is utilized. Energy sensors are placed in a different configuration such that equal stimulation by an electromagnetic source has no effect. The on/off switching is thus achieved by irradiation on one sensor (the "on" element) or the other of the pair (the "off" element). In addition, it is advantageous to have the microcontroller 212 capable of activating the "off" state and thus disconnect itself, and all other electronics the ON/OFF switch, from the battery. This is preferable enacted by the microcontroller 212 after a user-selected period of inactivity. Restoration of the "on" state is readily achieved in the base station electronics by means of a different irradiation preferring the "on" sensor.

It should be understood that the particular embodiments of the invention described above have been provided by way of example and that other modifications may occur to a person skilled in the art without departing from the scope and spirit of the invention as expressed in the appended claims and their equivalents.

What is claimed is:

1. A wafer sensor structure comprising:
    a housing layer having pocket openings formed therethrough;
    a circuit layer having a sensor element and electronic elements mounted on an upper surface thereof for registration with the pocket openings formed in the housing layer, the upper surface of the circuit layer being bonded to a lower surface of the housing layer; and
    a rigid back layer having an upper surface that is bonded to a lower surface of the circuit layer.

2. A wafer sensor structure as in claim 1, and wherein the upper surface of the circuit layer is bonded to the lower surface of the housing layer and the upper surface of the back layer is bonded to the lower surface of the circuit layer by a pressure sensitive adhesive.

3. A wafer sensor structure as in claim 1, and wherein the upper surface of the circuit layer is bonded to the lower surface of the housing layer and the upper surface of the back layer is bonded to the lower surface of the circuit layer by a thermal cure film adhesive.

4. A wafer sensor structure as in claim 1, and further comprising:
    a battery mounted on the upper surface of the circuit layer for registration with a corresponding pocket opening formed in the housing layer.

5. A wafer sensor structure as in claim 4, and further comprising:
    at least one solar element mounted on the upper surface of the circuit layer for registration with a corresponding pocket opening formed in the housing layer, the at least one solar element being connected to the battery for charging the battery.

6. A wafer sensor structure as in claim 1, and further comprising:
    a transmitter/receiver mounted on the upper surface of the circuit layer for wireless data communication between the wafer sensor structure and an external element.

7. A wafer sensor structure as in claim 6, and wherein the external element comprises a base station that is adapted for physically receiving the wafer sensor structure.

8. A wafer sensor structure as in claim 1, and wherein the sensor element comprises a pyroelectric wafer.

9. A wafer sensor structure as in claim 8, and wherein the pyroelectric wafer includes a laser exposed surface that has a layer of Palladium about 1 μm thick formed thereon.

10. A wafer sensor structure as in claim 8, and wherein the pyroelectric wafer includes a laser exposed surface that has a layer of Chromium about 0.7 μm thick formed thereon and a layer of Palladium about 0.3 μm thick formed on the layer of Chromium.

11. A wafer sensor structure as in claim 8, and wherein the pyroelectric wafer and the electronic components are connected for measuring laser energy.

12. A wafer sensor structure as in claim 1, and wherein the housing layer comprises a silicon wafer.

13. A wafer sensor structure as in claim 12, and wherein the silicon wafer is about 300 mm diameter.

14. A wafer sensor structure as in claim 1, and wherein the housing layer comprises chemically etched aluminum.

15. A wafer sensor structure as in claim 1, and wherein the sensor element comprises a sensor selected from the group consisting of a thermocouple, a photodiode, a thermopile, a pressure sensor, an accelerometer, a strain gauge and a CMOS camera circuit.

16. A wafer sensor system as in claim 1, and wherein the back layer is formed of a material selected from the group consisting of stainless steel, PEEK and silicon.

17. A wafer sensor system comprising:
    (a) a wafer sensor structure that includes
        a housing layer having pocket openings formed therethrough;
        a circuit layer having a sensor element and electronic elements mounted on an upper surface thereof for registration with the pocket openings formed in the housing layer, the upper surface of the circuit layer being bonded to a lower surface of the housing layer; and
        a rigid back layer having an upper surface that is bonded to a lower surface of the circuit layer; and
    (b) a base station adapted for connection to the wafer sensor structure for electrical communication between the wafer sensor structure and the base station.

18. A wafer sensor system as in claim 17, and wherein the base station is further adapted for connection to a host computer system for electrical communication between the host computer system and the base station.

19. A wafer sensor system as in claim 17, and wherein the wafer sensor structure includes a receiver/transmitter for wireless communication between the wafer sensor structure and the base station.

* * * * *